United States Patent
Han et al.

(10) Patent No.: US 7,378,880 B2
(45) Date of Patent: May 27, 2008

(54) FREQUENCY COMPARATOR

(75) Inventors: Song-Rong Han, BanQiao (TW); Yuh-Kuang Tseng, BaDe (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/381,139

(22) Filed: May 2, 2006

(65) Prior Publication Data

US 2007/0257709 A1 Nov. 8, 2007

(51) Int. Cl.
*H03D 13/00* (2006.01)

(52) U.S. Cl. .......................................... 327/43; 327/39

(58) Field of Classification Search ..................... 327/2, 327/3, 5, 7, 8, 12, 23, 26, 31, 35, 39, 40–43, 327/47–49, 147–150, 156–159; 331/1 A, 331/10–12, 17, 18, DIG. 2; 375/373–376
See application file for complete search history.

(56) References Cited

U.S. PATENT DOCUMENTS

| | | | | |
|---|---|---|---|---|
| 5,740,213 A | * | 4/1998 | Dreyer | 375/374 |
| 6,005,425 A | * | 12/1999 | Cho | 327/156 |
| 6,919,759 B2 | * | 7/2005 | Chuan | 327/552 |
| 7,061,290 B2 | * | 6/2006 | Hasegawa | 327/157 |
| 7,129,789 B2 | * | 10/2006 | Hsiao et al. | 331/1 A |
| 7,256,656 B2 | * | 8/2007 | Wu | 331/17 |

* cited by examiner

*Primary Examiner*—Tuan T. Lam
*Assistant Examiner*—Patrick O'Neill
(74) *Attorney, Agent, or Firm*—Winston Hsu

(57) ABSTRACT

A frequency comparator comparing frequencies of a first clock signal and a reference clock signal. The frequency comparator includes a phase-frequency detector and a comparison module. The phase-frequency detector receives the first clock signal and the reference clock signal, and outputs an up clock signal and a down clock signal. The pulse-width difference between the up clock signal and the down clock signal corresponds to the phase difference between the first clock signal and the reference clock signal. The comparison module compares the frequencies of the first clock signal and the reference clock signal based on how many times the pulse width of the up clock signal is larger or shorter than that of the down clock signal in a predetermined period.

9 Claims, 12 Drawing Sheets

| Q3 | Q5 | Q4 | Q6 | FD output |
|---|---|---|---|---|
| 0 | 0 | * | * | Don't care |
| 0 | 1 | 0 | 0 | Up |
| 0 | 1 | 0 | 1 | Up |
| 0 | 1 | 1 | 0 | Up |
| 0 | 1 | 1 | 1 | Don't care |
| 1 | 0 | 0 | 0 | Down |
| 1 | 0 | 0 | 1 | Down |
| 1 | 0 | 1 | 0 | Down |
| 1 | 0 | 1 | 1 | Don't care |
| 1 | 1 | * | * | Don't care |

FIG. 3

FREQUENCY COMPARATOR

BACKGROUND OF THE INVENTION

1. Field of the Invention

The invention relates to a frequency comparator, and in particular to a frequency comparator utilizing a phase-frequency detector.

2. Description of the Related Art

FIG. 1 is a schematic diagram of a conventional frequency comparator 100. The frequency comparator 100 is used to compare frequencies of an in-phase clock signal CLKI and a reference clock signal CLKR. As shown in the figure, in the frequency comparator 100, three D-flip flops D1, D3 and D5 are connected in series, wherein a data input D and a clock input CK of the D-flip flop D1 respectively receiving CLKI and CLKR. Similarly, three D-flip flops D2, D4 and D6 are connected in series, wherein a data input D and a clock input CK of the D-fip flop D2 respectively receiving a quadrature clock signal CLKQ and the reference clock signal CLKR. The in-phase clock signal CLKI and the quadrature CLKQ have the same frequency but differ 90 degrees in phase. At every transition of the reference clock signal CLKR, the D-flip flops D1 and D2 sample the in-phase clock signal CLKI and the quadrature clock signal CLKQ respectively, and the D flip-flops D3-D6 serve as registers to save the sampled results of the D-flip flops D1 and D2. A logic circuit 12 receives output signals Q3-Q6 and inverted output signals Q3b-Q6b of the D-flops D3-D6, where Q3b-Q6b denote inverse signals of the output signals Q3-Q6 respectively, and outputs an up signal F_up and a down signal F_dn representative of the frequency comparison result of CLKI and CLKR.

FIG. 2A and 2B are timing diagrams of the reference clock signal CLKR, the in-phase clock signal CLKI, and the quadrature clock signal CLKQ in cases where the frequency of CLKI (or CLKQ) is lower and higher than that of CLKR respectively. Referring to FIG. 2A, it is shown that (CLKI, CLKQ) changes as: (1,0)→(0, 0)→(0, 1)→(1, 1)→(1, 0) . . . , and so forth. Similarly, turning to FIG. 2B, it is shown that (CLKI, CLKQ) changes as: (1, 1)→(0, 1)→(0, 0)→(1, 0)→(1,1).

FIG. 3 is a truth table of the logic circuit 12 of FIG. 1. Thus, according to the truth table, when the up signal F_up is high and the down signal F_dn is low, the frequency of the in-phase clock signal CLKI (or the quadrature clock signal CLKQ) is beyond that of the reference clock signal CLKR. Conversely, when F_up is low and F_dn is high, the frequency of CLKI (or CLKQ) is below that of CLKR.

However, the difference between frequencies of the in-phase clock signal CLKI and the reference clock signal CLKR is limited to a medium range for accurate comparison result based on the truth table of FIG. 3. Resultingly, this limits applications of the frequency comparator 100.

BRIEF SUMMARY OF THE INVENTION

Accordingly, an object of the invention is to provide a frequency comparator with high resolution for broader frequency comparison range and higher applicability.

A frequency comparator is disclosed to compare frequencies of a first clock signal and a reference clock signal. The frequency comparator comprises a phase-frequency detector receiving the first clock signal and the reference clock signal, outputting an up clock signal and a down clock signal, wherein the pulse-width difference between the up clock signal and the down clock signal corresponds to the phase difference between the first clock signal and the reference clock signal, and a comparison module comparing the frequencies of the first clock signal and the reference clock signal based on total pulse-width difference between the up clock signal and the down clock signal in a predetermined period.

Another frequency comparator is disclosed, comparing frequencies of a first clock signal and a reference clock signal. The frequency comparator comprises a phase-frequency detector receiving the first clock signal and the reference clock signal, outputting an up clock signal and a down clock signal, wherein the pulse-width difference between the up clock signal and the down clock signal corresponds to the phase difference between the first clock signal and the reference clock signal, and a comparison module comparing the frequencies of the first clock signal and the reference clock signal based on how many times the pulse width of the up clock signal is larger or shorter than that of the down clock signal in a predetermined period.

BRIEF DESCRIPTION OF THE DRAWINGS

The invention can be more fully understood by reading the subsequent detailed description and examples with references made to the accompanying drawings, wherein:

FIG. 3 is a truth table of the logic circuit of FIG. 1;

DETAILED DESCRIPTION OF THE INVENTION

Figure 1:
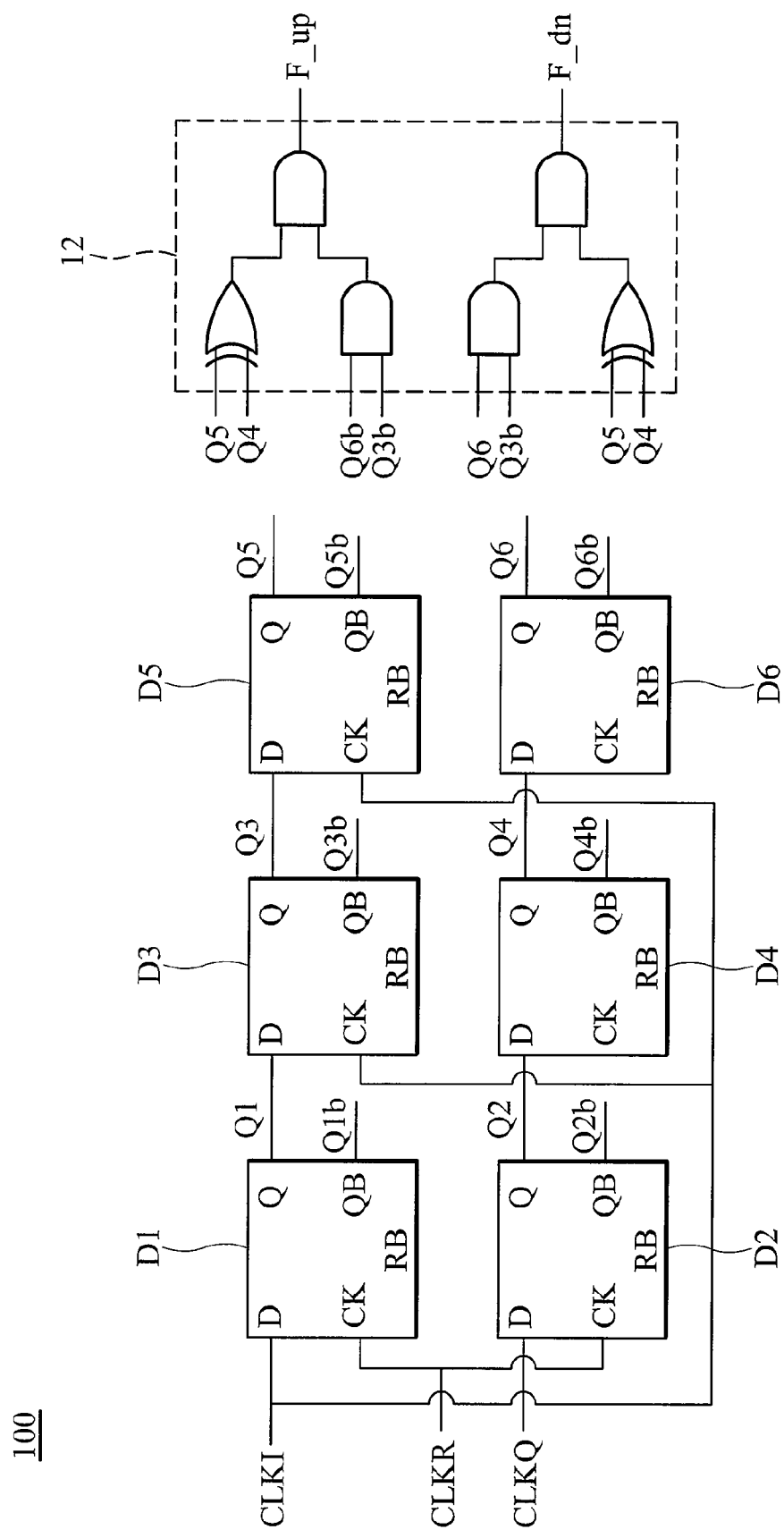
FIG. 1 is a schematic diagram of a conventional frequency comparator.
Figure 2A:
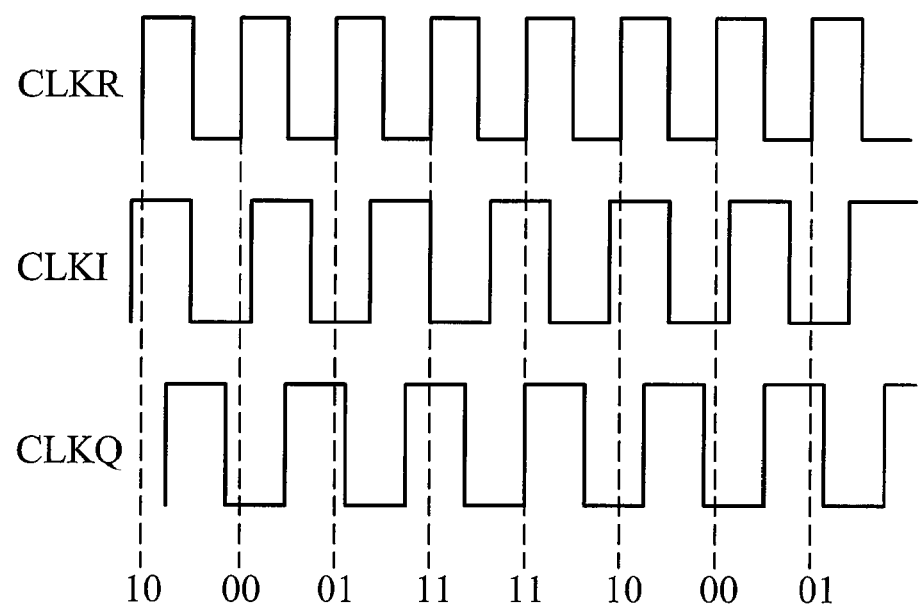
FIGS. 2A and 2B are timing diagrams of the reference clock signal, the in-phase clock signal, and the quadrature clock signal in the cases where the frequency of the in-phase clock signal (or the quadrature clock signal) is lower and higher than that of the reference clock signal respectively.
Figure 2B:
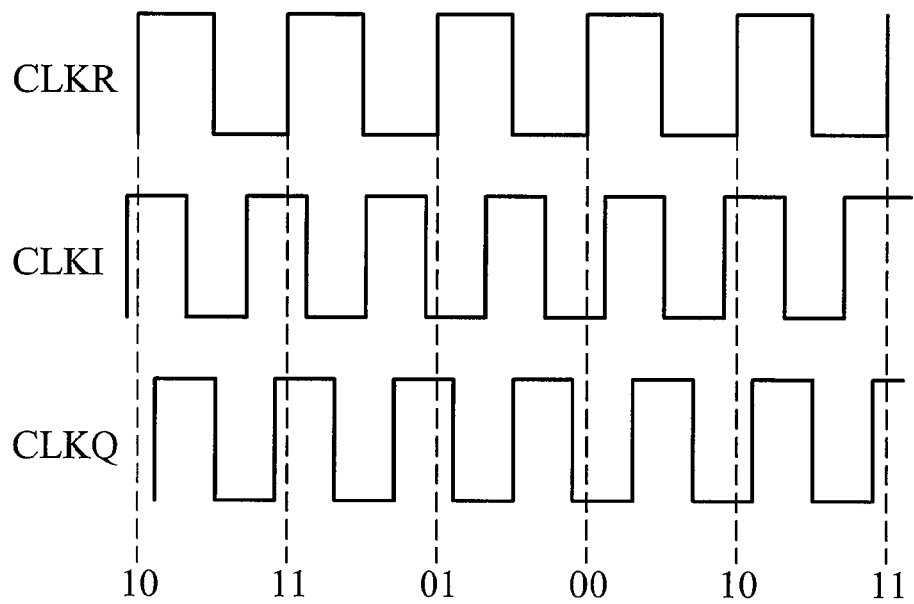
Figure 4:
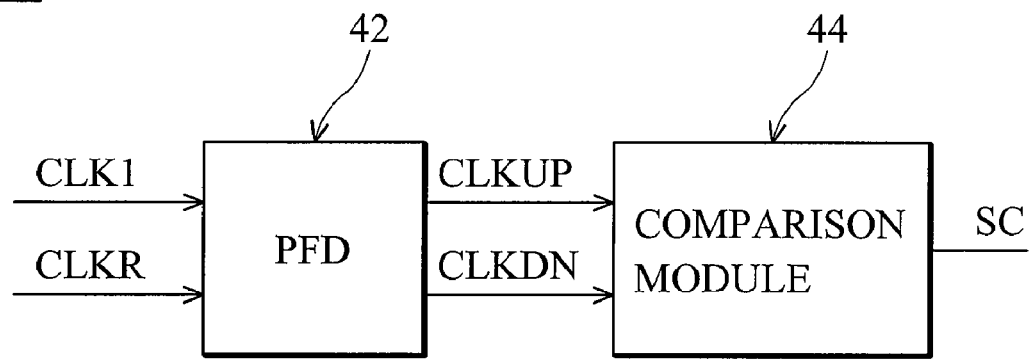
FIG. 4 is a block diagram of a frequency comparator in accordance with an embodiment of the invention.

FIG. 4 is a block diagram of a frequency comparator in accordance with an embodiment of the invention. As shown in the figure, a frequency comparator 400 comprises a phase-frequency detector 42 receiving a first clock signal CLK1 and a reference clock signal CLKR and outputting an up clock signal CLKUP and a down clock signal CLKDN to a comparison module 44. The comparison module 44 then compares the frequencies of the first clock signal and the reference clock signal based on total pulse-width difference between the up clock signal and the down clock signal in a predetermined period and outputs a comparison signal SC corresponding to the comparison result The pulse-width difference between the up clock signal CLKUP and the down clock signal CLKDN corresponds to the phase difference between the first clock signal CLK1 and the reference clock signal CLKR, as:

$$\Delta PW \propto \Delta\theta \quad (1),$$

where $\Delta PW$ is pulse-width difference between the up clock signal CLKUP and the down clock signal CLKDN, and $\Delta\theta$ is the phase difference between the first clock signal CLK1 and the reference clock signal CLKR. Phase difference between the first clock signal CLK1 and the reference clock signal CLKR has a relationship with the frequencies of the first clock signal CLK1 and the reference clock signal CLKR as followings:

$$\Delta\theta = \int 2\pi(f_1 - f_R)dt \quad (2),$$

where $f_1$ and $f_2$ are frequencies of the first clock signal CLK1 and the reference clock signal CLKR respectively. As expressed in formulae (1) and (2), the total pulse width of the up clock signal CLKUP is longer or shorter than that of the down clock signal CLKDN in the predetermined period T when the frequency of the first clock signal CLK1 is higher or lower than that of the reference clock signal CLKR respectively. Accordingly, the comparison module 44 can compare the frequencies of the first clock signal CLK1 and the reference clock signal CLKR by comparing the total pulse-widths of the up clock signal CLKUP and the down clock signal CLKDN in the predetermined period.

Figure 5:
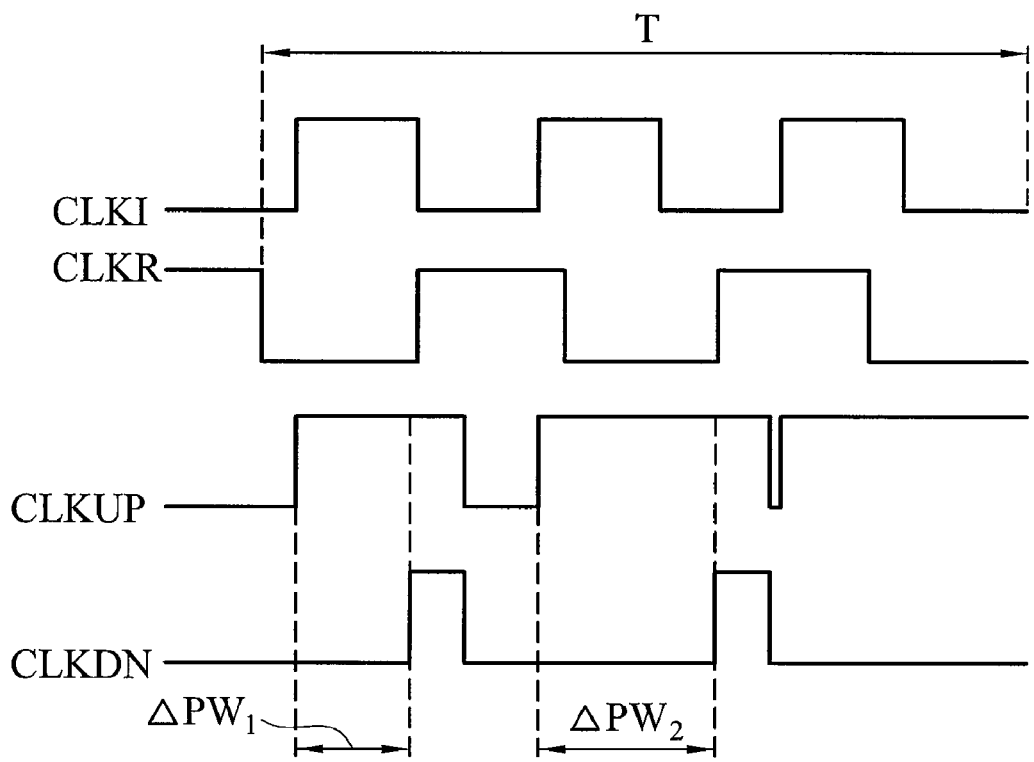
FIG. 5 is a timing diagram showing timings of the first clock signal, the reference clock signal, the up clock signal and the down clock signal in an exemplary case where the frequency of the first clock signal is higher than that of the reference clock signal.

FIG. 5 is a timing diagram showing timings of the first clock signal CLK1, the reference clock signal CLKR, the up clock signal CLKUP and the down clock signal CLKDN in an exemplary case where the frequency of the first clock signal CLK1 is higher than that of the reference clock signal CLKR. Since the first clock signal CLK1 and the reference clock signal CLKR are of different frequencies, phase difference between them ($\Delta PW_1$, $\Delta PW_2$ and etc.) varies with time. As shown in the figure, the total pulse width of the up clock signal CLKUP is longer than that of the down clock signal CLKDN in the predetermined period T. Typically, the predetermined period T is selected sufficiently long (for example, more than 10 times the period of the reference clock signal CLKR) to obtain more accurate comparison result and high resolution.

Figure 6:
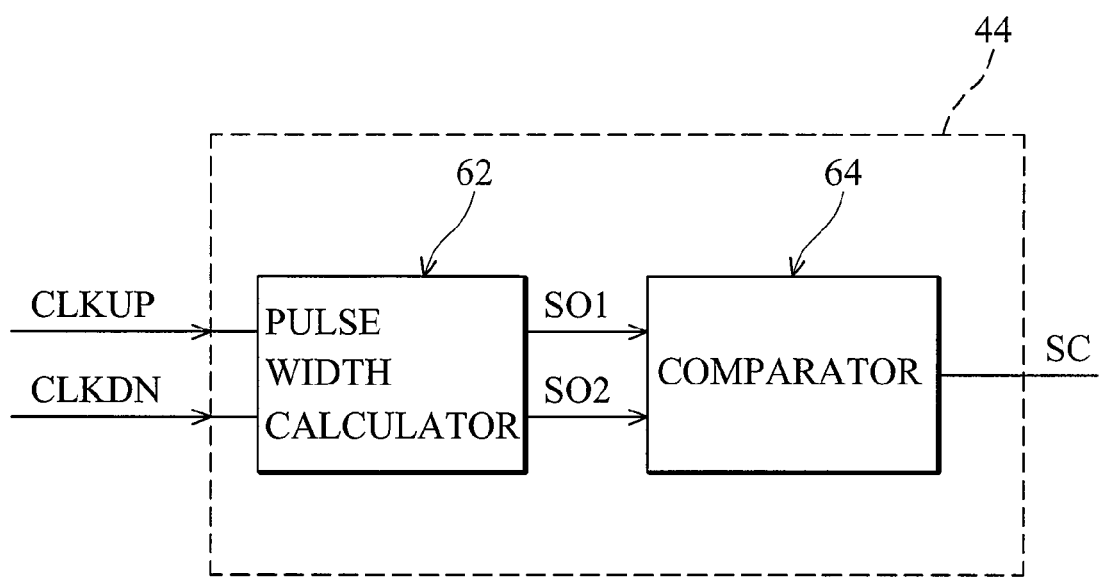
FIG. 6 is a block diagram of the comparison module of FIG. 4 in accordance with an embodiment of the invention.

FIG. 6 is a block diagram of the comparison module 44 of FIG. 4 in accordance with an embodiment of the invention. As shown in the figure, the comparison module 44 comprises a pulse-width calculator 62 receiving the up clock signal CLKUP and the down clock signal CLKDN to output first and second output signals SO1 and SO2 corresponding respectively to the total pulse widths of the up clock signal CLKUP and the down clock signal CLKDN in the predetermined period. A comparator 64 then receives the first and second output signals SO1 and SO2 to compare the frequencies of the first clock signal CLK1 and the reference clock signal CLKR based on the first and second output signals SO1 and SO2.

Figure 7A:
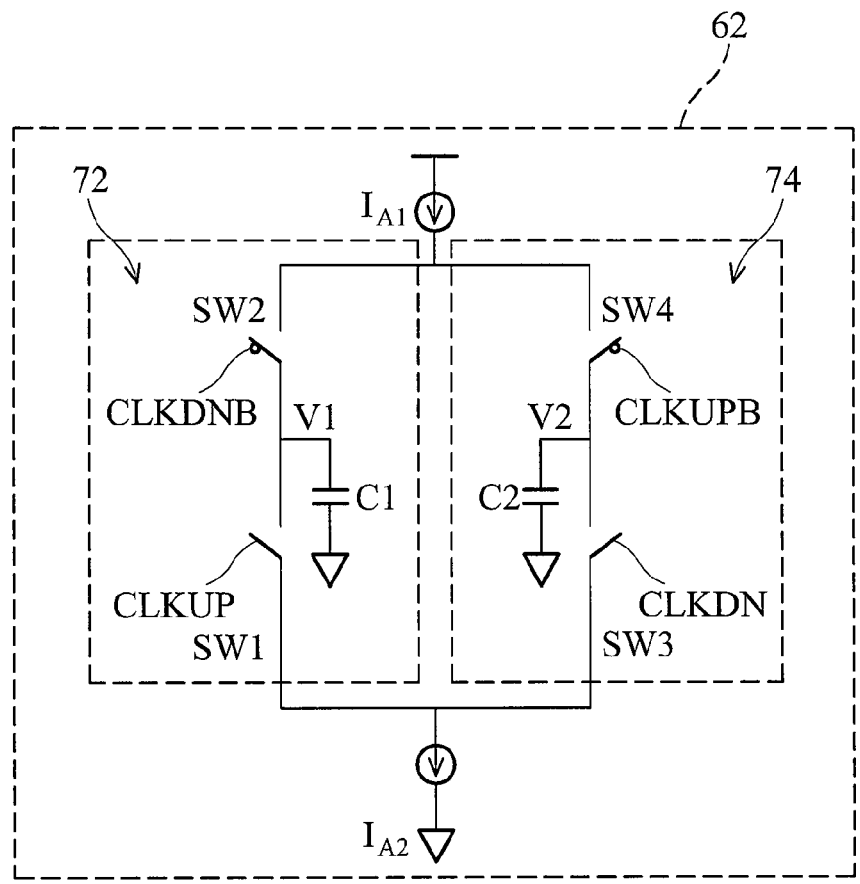
FIGS. 7A and 7B are respectively schematic diagrams of the pulse-width calculator and the comparator of FIG. 6 in accordance with an embodiment of the invention.
Figure 7B:
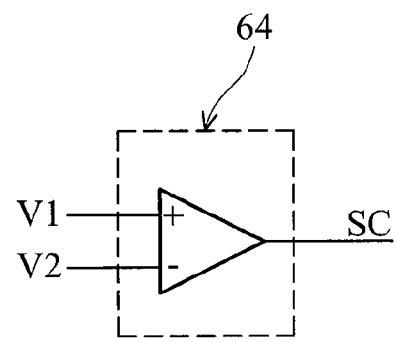

FIGS. 7A and 7B are respective schematic diagrams of the pulse-width calculator 62 and the comparator 64 of FIG. 6 in accordance with an embodiment of the invention. Referring to FIG. 7A, the phase-frequency detector 42 (not shown) further outputs an inverted up clock signal CLKUPB and an inverted down clock signal CLKDNP, wherein the inverted up clock signal CLKUPB and the inverted down clock signal CLKDNP are respectively inverted signals of the up clock signal CLKUP and the down clock signal CLKDN. As shown in the figure, the pulse width calculator 62 comprises a first and second charging-discharging circuit 72 and 74. The first charging-discharging circuit 72 comprises a first and second switch SW1 and SW2 controlled respectively by the up clock signal CLKUP and the inverted down clock signal CLKDNB and a first capacitor C1 with one end connected to the first and second switches SW1 and SW2, wherein voltage V1 at the end serves as the first output signal SO1 transmitted to the comparator 64 (not shown). Similarly, the second charging-discharging circuit 74 comprises third and fourth switches SW3 and SW4 controlled respectively by the down clock signal CLKDN and the inverted up clock signal CLKUPB and a second capacitor C2 with one end connected to the third and fourth switches SW3 and SW4, wherein voltage V2 at the end serves as the second output signal SO2 transmitted to the comparator 64. Referring to FIG. 7B, a comparator 72 then compares the voltages V1 and V2 and outputs the comparison signal SC.

Turning to FIG. 7A, when the down clock signal CLKDN is at high level, the first and second capacitors C1 and C2 are charged with a fixed current I generated by a first current source $I_{41}$ and discharged through the fixed current I generated by a second current source $I_{42}$ respectively. Conversely, when the up clock signal CLKUP is at high level, the first and second capacitor C1 and C2 are discharged with the fixed current I generated by the second current source $I_{42}$ and charged with the fixed current I generated by the first current source $I_{41}$ respectively. Accordingly, the voltages V1 and V2 at the end of the predetermined period correspond respectively to the total pulse widths of the up clock signal CLKUP and the down clock signal CLKDN in the predetermined period.

It is noted that the schematic diagrams shown in the FIGS. 7A and 7B are illustrated for only exemplary purposes. Other schematic diagrams showing generation of a first and second output signals SO1 and SO2 of voltages corresponding respectively to the total pulse widths of the up clock signal CLKUP and the down clock signal CLKDN in the predetermined period can also be used as the pulse-width calculator 62.

Figure 8:
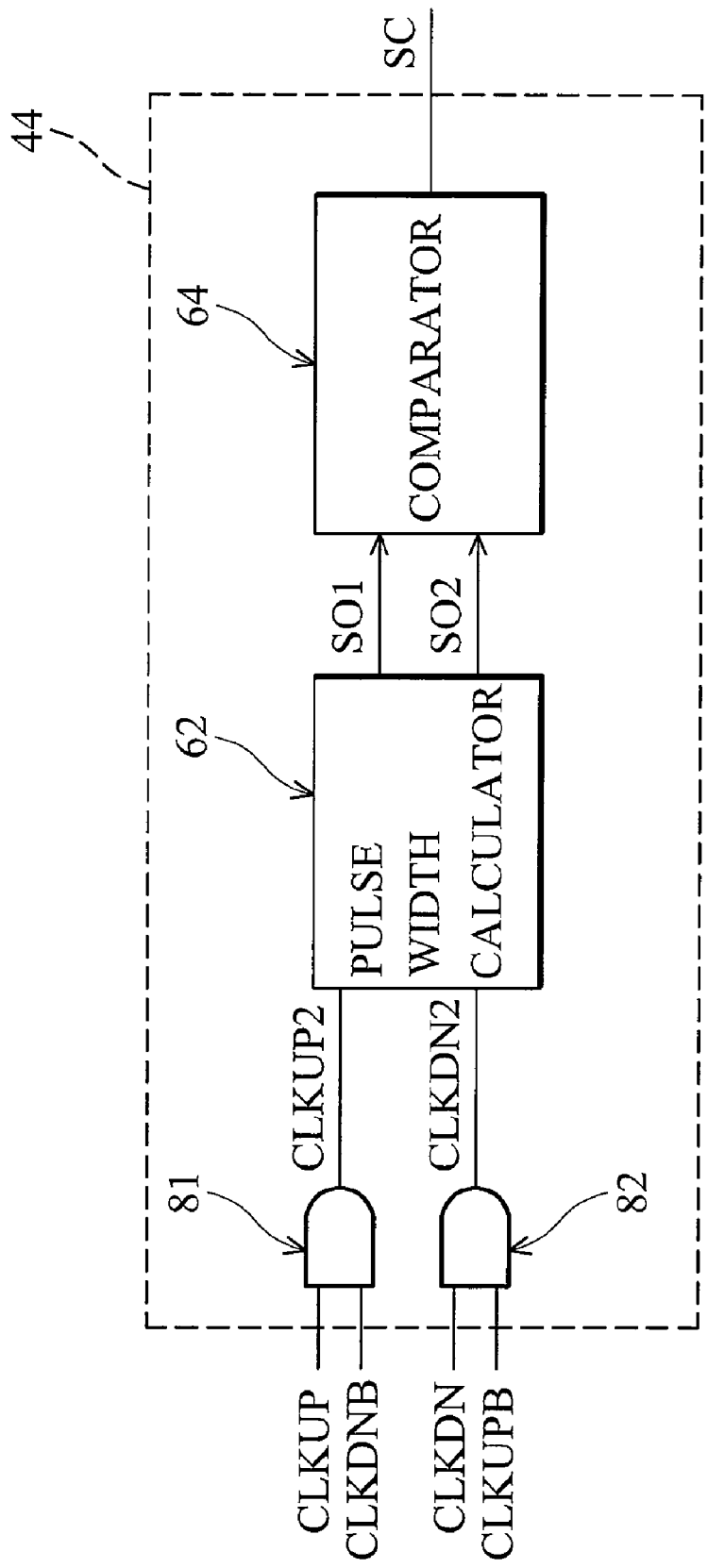
FIG. 8 is a block diagram of the comparison module 44 of FIG. 4 in accordance with another embodiment of the invention.

FIG. 8 is a block diagram of the comparison module 44 of FIG. 4 in accordance with another embodiment of the invention, differing from FIG. 6 in addition of first and second AND gates 81 and 82, respectively receiving the up clock signal CLKUP and an inverted down clock signal CLKDNB, and the down clock signal CLKDN and an inverted up clock signal CLKUPB, and respectively outputting a second up clock signal CLKUP2 and a second down clock signal CKLDN2 to the pulse width calculator 62. The inverted up clock signal CLKUPB and the inverted down clock signal CLKDNB can also be generated by the phase-frequency detector 42 (not shown). Rather than receiving the up clock signal CLKUP and the down clock signal CLKDN as in FIG. 6, the pulse-width calculator 62 receives the second up clock signal CLKUP2 and the second down clock signal CLKDN2 to output first and second output signals SO1 and SO2 corresponding respectively to the total pulse widths of the second up clock signal CLKUP2 and the second down clock signal CLKDN2 in the predetermined period. The comparator 64 further receives the first and second output signals SO1 and SO2 to compare the frequencies of the first clock signal CLK1 and the reference clock signal CLKR based on the first and second output signals SO1 and SO2.

The operations of the pulse width calculator 62 and the comparator 64 in FIG. 8, similar to those in FIG. 6, are not repeated for brevity. For example, the structure shown of FIG. 7 can be used as the pulse width calculator 62 with only replacement of the up clock signal CLKUP, the down clock signal CLKDN, the inverted up clock signal CLKUPB and the inverted down clock signal CLKDNB with the second up clock signal CLKUP2, the second down clock signal CLKDN2, a second inverted up clock signal and a second inverted down clock signal, respectively, wherein the second inverted up clock signal and the second inverted down clock signal are respectively inverted signals of the second up clock signal CLKUP2 and the second down clock signal CLKDN2.

Figure 9:
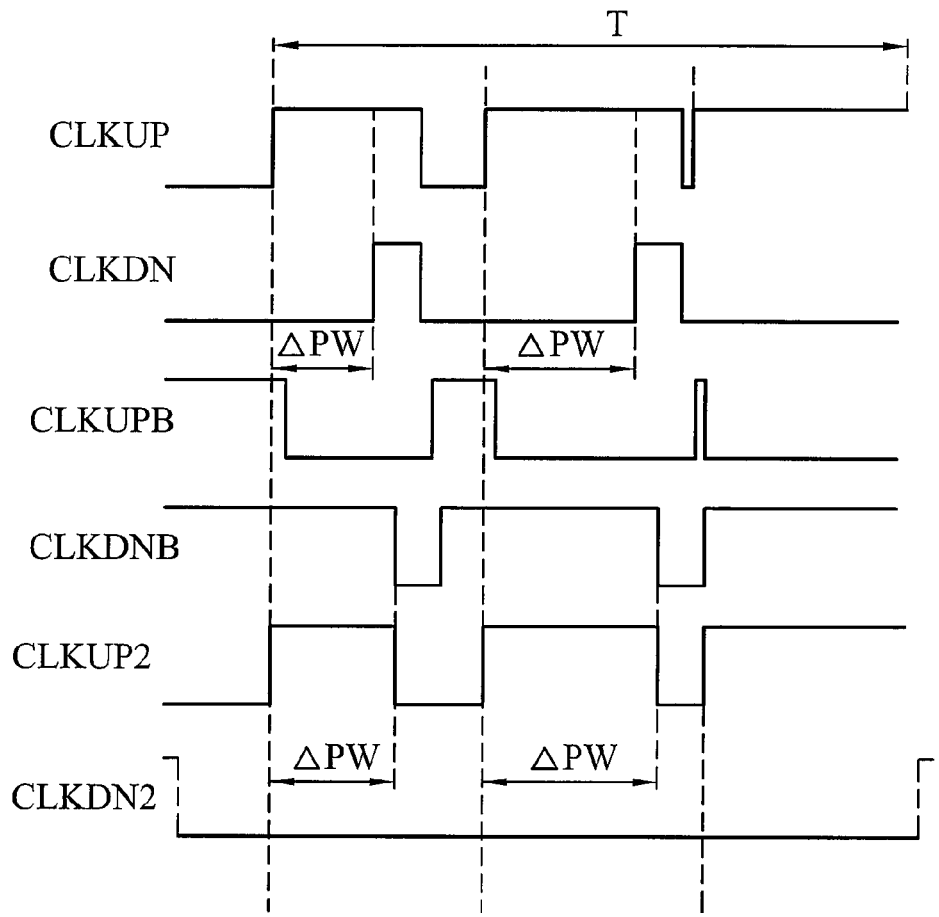
FIG. 9 is a timing diagram showing timings of the up clock signal, the down clock signal, the inverted up clock signal, the inverted down clock signal, the second up clock signal and the second down clock signal corresponding to the first clock signal and the reference clock signal shown of FIG. 5.

FIG. 9 is a timing diagram showing timings of the up clock signal CLKUP, the down clock signal CLKDN, the inverted up clock signal CLKUPB, the inverted down clock signal CLKDNB, the second up clock signal CLKUP2 and the second down clock signal CLKDN2 corresponding to the first clock signal CLK1 and the reference clock signal CLKR of FIG. 5 where the frequency of the first clock signal CLK1 is higher than that of the reference clock signal CLKR. It is shown that the total pulse-width difference between the second up clock signal CLKUP2 and the second down clock signal CLKDN2 is equal to that between the up clock signal CLKUP and the down clock signal CLKDN. Accordingly, the frequencies of the first clock signal CLK1 and the reference clock signal CLKR can be compared based on the difference between total pulse widths of the second up clock signal CLKUP2 and the second down clock signal CLKDN2 in the predetermined period T.

Figure 10:
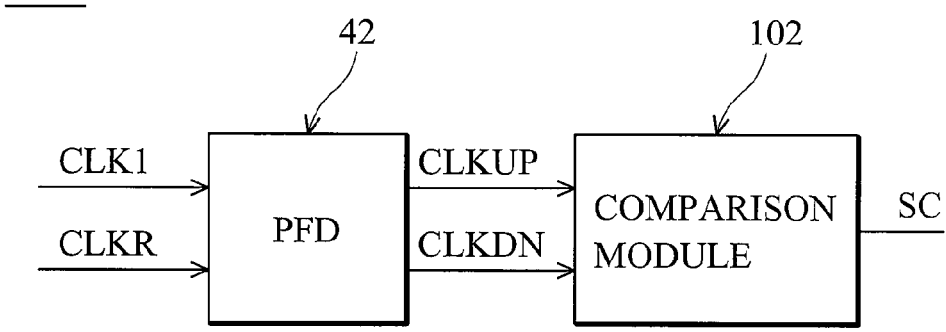
FIG. 10 is a block diagram of a frequency comparator in accordance with another embodiment of the invention.

FIG. 10 is a block diagram of a frequency comparator 1000 in accordance with another embodiment of the invention, differing from the frequency comparator 400 of FIG. 4 in replacement with another comparison module 102 in FIG. 10 comparing the frequencies of the first clock signal CLK1 and the reference clock signal CLKR based on how many times the pulse width of the up clock signal CLKUP is larger or shorter than that of the down clock signal CLKDN in a predetermined period. The reason why the replacement is possible is also indicated in formulae (1) and (2), which shows that determination of the sign of $\Delta\theta$ is sufficient to determine the sign of $(f_1-f_R)$.

Figure 11:
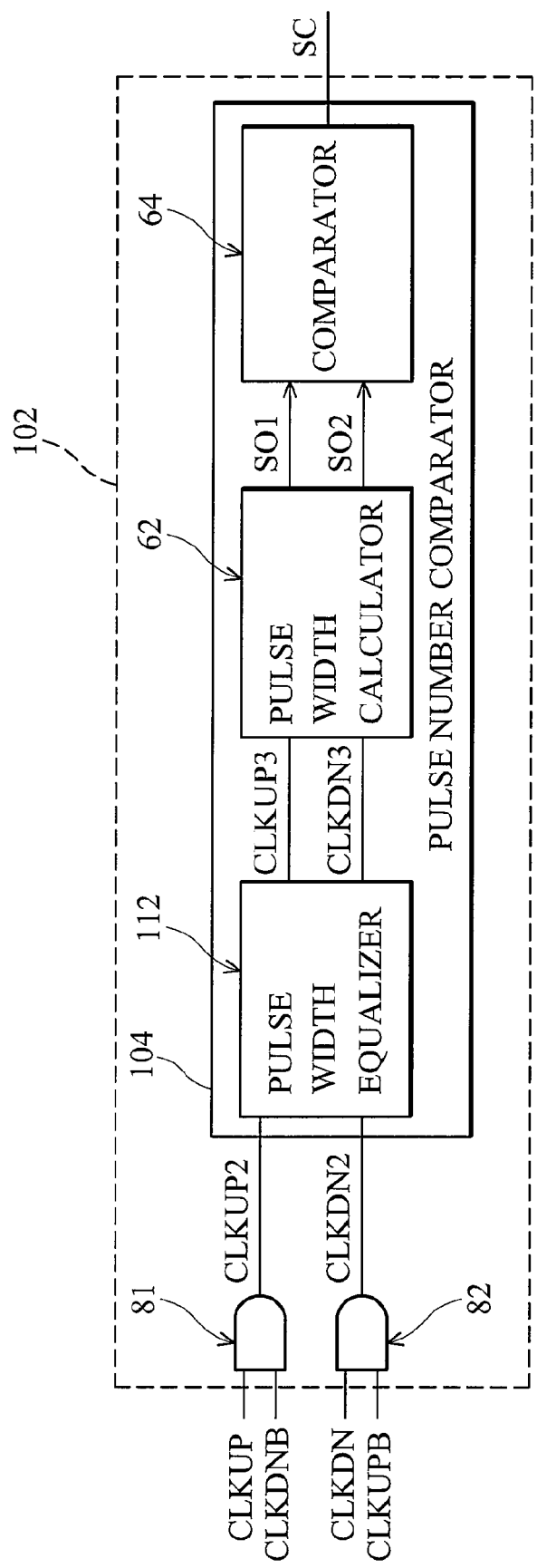
FIG. 11 shows a detailed block diagram for the pulse number comparator in accordance with an embodiment of the invention.

FIG. 11 is a block diagram of the comparison module 102 of FIG. 10 in accordance with an embodiment of the invention. As shown in the figure, the phase-frequency detector (not shown) further outputs an inverted up clock signal CLKUPB and an inverted down clock signal CLKDNB, wherein the inverted up clock signal CLKUPB and the inverted down clock signal CLKDNB are respectively inverted signals of the up clock signal CLKUP and the down clock signal CLKDN. The comparison module 102 comprises first and second AND gates 81 and 82, and a pulse number comparator 104. The first and second AND gates 81 and 82 respectively receive the up clock signal CLKUP and the inverted down clock signal CLKDNB, and the down clock signal CLKDN and inverted up clock signal CLKUPB, and respectively output a second up clock signal CLKUP2 and a second down clock signal CLKDN2 to the pulse number comparator 104. The pulse number comparator 104 then compares the frequencies of the first clock signal CLKUP and the reference clock signal CLKR based on the difference in the total pulse numbers of the second up clock signal CLKUP2 and the second down clock signal CLKDN2 in a predetermined period, and outputs a comparison signal SC corresponding the comparison result.

FIG. 11 also shows a detailed block diagram for the pulse number comparator 104 in accordance with an embodiment of the invention, differing from that in FIG. 8 by addition of a pulse width equalizer 112 between the first and second AND gates 81/82 and the pulse-width calculator 62 of FIG. 11. The pulse width equalizer 112 converts the second up clock signal CLKUP2 and the second down clock signal CLKDN2 to a third up clock signal CLKUP3 and a third down clock signal CLKDN3 both with constant pulse widths and transmits the third up clock signal CLKUP3 and the third down clock signal CLKDN3 to the pulse-width calculator 62. The operations of the pulse width calculator 62 and the comparator 64 are similar to those in FIG. 6, and are not repeated for brevity.

Since both the third up clock signal CLKUP3 and the third down clock signal CLKDN3 have constant pulse widths, the first and second output signals SO1 and SO2 generated by the pulse-width calculator 62 correspond respectively to not only the total pulse widths of the third up clock signal CLKUP3 and the third down clock signal CLKDN3 in the predetermined period, but also the total pulse widths of the second up clock signal CLKUP2 and the second down clock signal CLKDN2 in the predetermined period. Accordingly, the frequencies of the first clock signal CLK1 and the referenced clock signal can be compared based on the first and second output signals SO1 and SO2.

Figure 12:
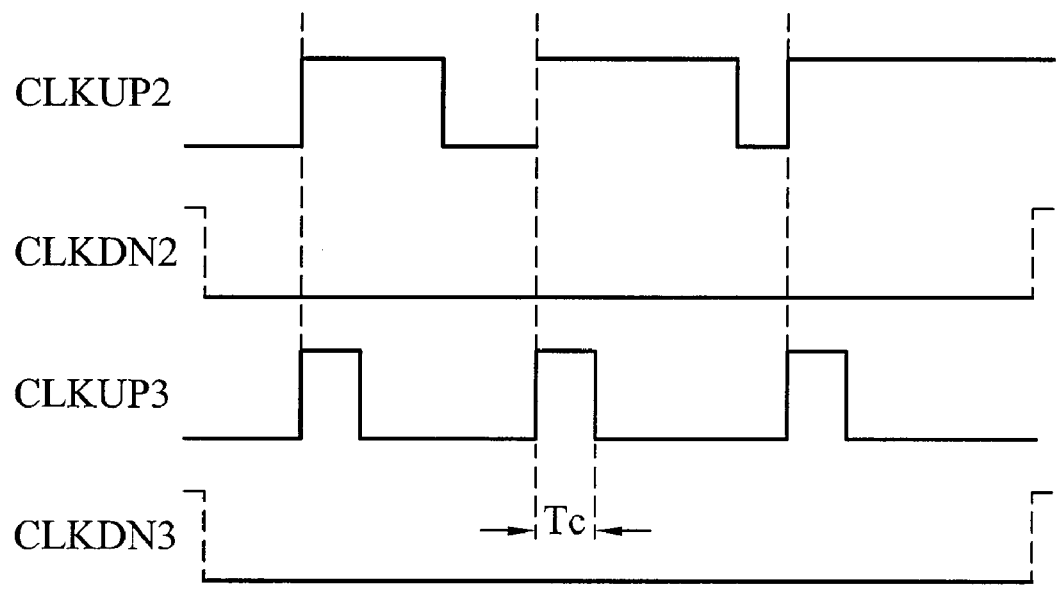
FIG. 12 is a timing diagram showing timings of the second up clock signal, the second down clock signal, the third up clock signal, and the third down clock signal corresponding to the first clock signal and the reference clock signal shown of FIG. 5.

FIG. 12 is a timing diagram showing timings of the second up clock signal CLKUP2, the second down clock signal CLKDN2, the third up clock signal CLKUP3, and the third down clock signal CLKDN3 corresponding to the first clock signal CLK1 and the reference clock signal CLKR of FIG. 5 where the frequency of the first clock signal CLK1 is higher than that of the reference clock signal CLKR. As shown in the figure, the third up clock signal CLKUP3, and the third down clock signal CLKDN3 have constant pulse width $T_C$.

Figure 13:
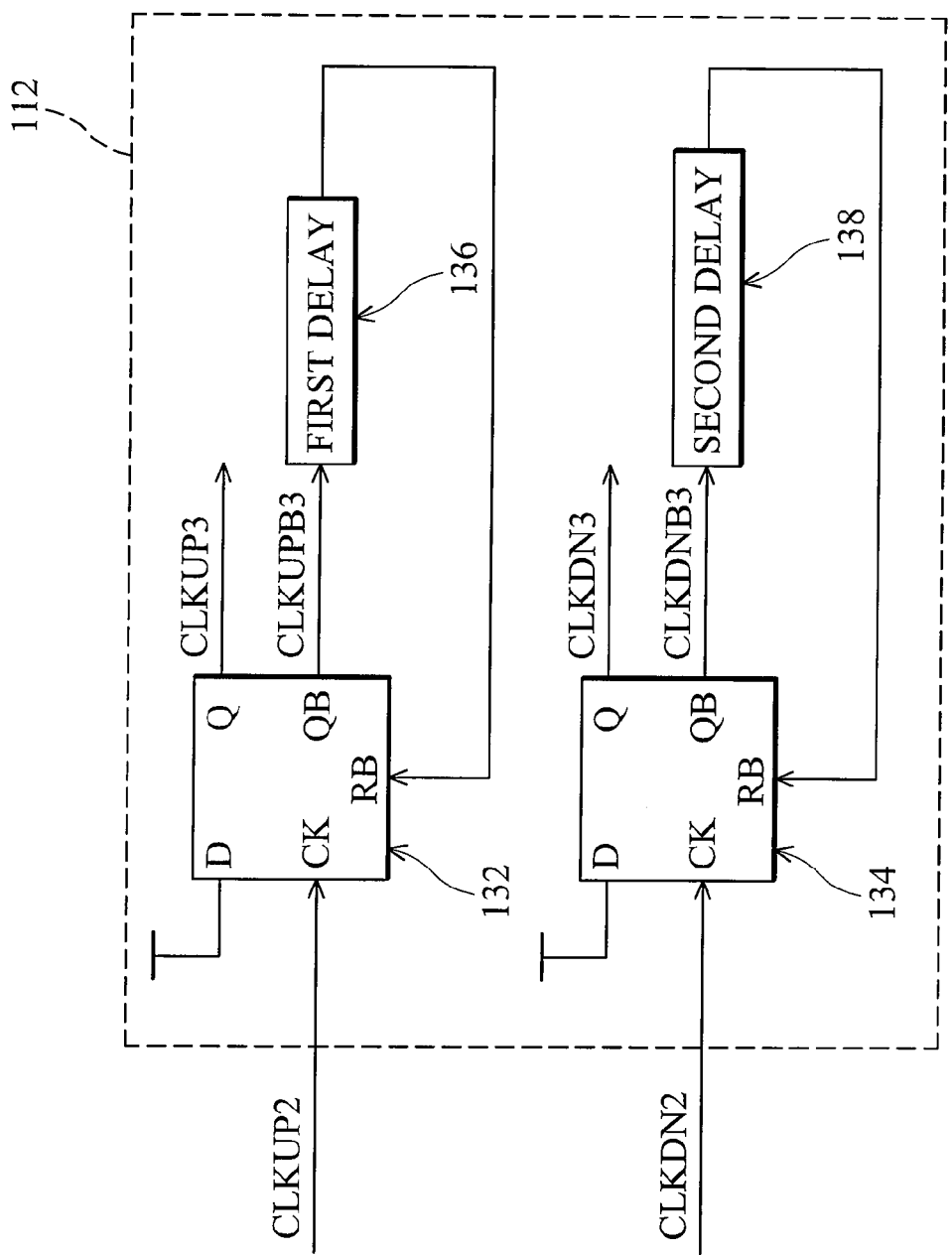
FIG. 13 is a schematic diagram of the pulse width equalizer of FIG. 11.

FIG. 13 is a schematic diagram of the pulse width equalizer 112 of FIG. 11. As shown in the figure, the pulse width equalizer 112 comprises a first and second D-flip flop 132 and 134 and a first and second delay 136 and 138. The first D-flip flop 132 has a clock input terminal CK receiving the second up clock signal CLKUP2, a data input terminal D connected to a voltage source, an output terminal Q providing the third up clock signal CLKUP3, an inverted output terminal QB providing an inverted signal of the third inverted up clock signal to an input terminal of the first delay 136, and a reset terminal RB connected to an output terminal of the first delay 136. Similarly, the second D-flip flop 134 has a clock input terminal CK receiving the second down clock signal CLKDN2, a data input terminal D connected to a voltage source, an output terminal Q providing the third down clock signal CLKDN3, an inverted output terminal QB providing an inverted signal of the third inverted down clock signal to an input terminal of the second delay 138, and a reset terminal RB connected to an output terminal of the second delay 138

The operations of the pulse width calculator 62 and the comparator 64 in FIG. 11 are similar to those in FIG. 6, and are not repeated for brevity. For example, the structure of FIG. 7 can be used as the pulse width calculator with only replacement of the up clock signal CLKUP, the down clock signal CLKDN, the inverted up clock signal CLKUPB and the inverted down clock signal CLKDNB with the third up clock signal CLKUP3, the third down clock signal CLKDN3, a third inverted up clock signal and a third inverted down clock signal, respectively, wherein the third inverted up clock signal and the third inverted down clock signal are respectively inverted signals of the third up clock signal CLKUP3 and the third down clock signal CLKDN3.

Figure 14:
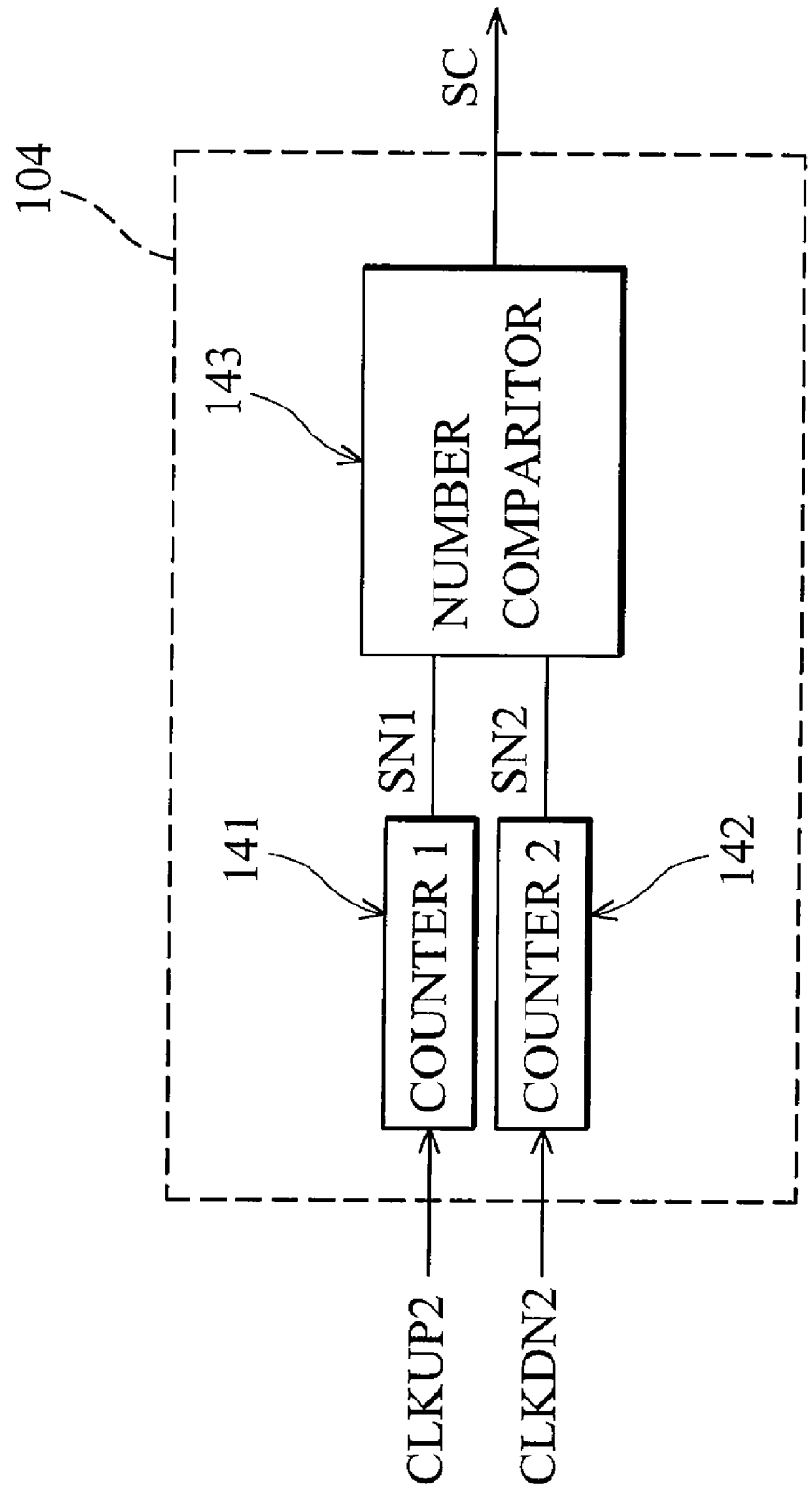
FIG. 14 is a detailed block diagram for the pulse number comparator of FIG. 11 in accordance with another embodiment of the invention.

FIG. 14 is a block diagram of the pulse number comparator 104 of FIG. 11 in accordance with another embodiment of the invention. As shown, in the pulse number comparator 104, a first and second counter 141 and 142 respectively receives the second up clock signal CLKUP2 and the second down clock signal CLKDN2 to respectively register the total pulse numbers of the second up clock signal CLKUP2 and second down clock signal CLKDN2 as first and second numbers. The first and second counter 141 and 142 then outputs a first and second number signal SN1 and SN2 representative respectively of the first and second numbers. A number comparator 143 receives the first and second number signals SN1 and SN2, compares the first and second numbers represented by the first and second number signals SN1 and SN2, and outputs the comparison signal SC corresponding thereto.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency comparator comparing frequencies of a first clock signal and a reference clock signal, comprising:
a phase-frequency detector receiving the first clock signal and the reference clock signal, outputting an up clock signal and a down clock signal, wherein a pulse-width difference between the up clock signal and the down clock signal corresponds to a phase difference between the first clock signal and the reference clock signal;
a comparison module comparing the frequencies of the first clock signal and the reference clock signal based on total pulse-width difference between the up clock signal and the down clock signal in a predetermined period;
wherein the phase-frequency detector further outputs an inverted up clock signal and an inverted down clock signal, wherein the inverted up clock signal and the inverted down clock signal are respectively inverted signals of the up clock signal and the down clock signal; and
wherein the comparison module comprises:
first and second AND gates respectively receiving the up clock signal and the inverted down clock signal, and the down clock signal and the inverted up clock signal, respectively outputting a second up clock signal and a second down clock signal;
a pulse width calculator receiving the second up clock signal and the second down clock signal, outputting a first and second output signal, wherein the first and second output signals respectively correspond to the total pulse widths of the second up clock signal and the second down clock signal in the predetermined period; and
a comparator receiving the first and second output signals to compare the frequencies of the first clock signal and the reference clock signal based on the first and second output signals.

2. The frequency comparator of claim 1,
wherein the voltages of the first and second output signals respectively correspond to the total pulse widths of the second up clock signal and the second down clock signal in the predetermined period; and
wherein the comparator compares the frequencies of the first clock signal and the reference clock signal by comparing the voltages of the first and second output signals.

3. The frequency comparator of claim 2, wherein the pulse width calculator comprises:
a first charging-discharging circuit comprising:
first and second switches respectively controlled by the second up clock signal and a second inverted down clock signal, wherein the second inverted down clock signal is an inverted signal of the second down clock signal; and
a first capacitor, with one end connected to the first and second switches and outputting the first output signal, discharged when the second up clock signal is at a first level and charged when the second inverted down clock signal is at a second level; and
a second charging-discharging circuit comprising:
third and fourth switches respectively controlled by the second down clock signal and a second inverted up clock signal, wherein the second inverted up clock signal is an inverted signal of the second up clock signal; and
a second capacitor, with one end connected to the third and fourth switches and outputting the second output signal, discharged when the second down clock signal is at the first level and charged when the second inverted up clock signal is at the second level.

4. A frequency comparator comparing frequencies of a first clock signal and a reference clock signal, comprising:
a phase-frequency detector receiving the first clock signal and the reference clock signal, outputting an up clock signal and a down clock signal, wherein a pulse-width difference between the up clock signal and the down clock signal corresponds to a phase difference between the first clock signal and the reference clock signal;
a comparison module comparing the frequencies of the first clock signal and the reference clock signal based on how many times the pulse width of the up clock signal is larger or shorter than that of the down clock signal in a predetermined period;
wherein the phase-frequency detector further outputs an inverted up clock signal and an inverted down clock signal, wherein the inverted up clock signal and the inverted down clock signal are respectively inverted signals of the up clock signal and the down clock signal; and
wherein the comparison module comprises:
first and second AND gates respectively receiving the up clock signal and the inverted down clock signal, and the down clock signal and inverted up clock signal, respectively outputting a second up clock signal and a second down clock signal; and a pulse number comparator receiving the second up clock signal and the second down clock signal to compare the frequencies of the first clock signal and the reference clock signal based on the difference in the total pulse numbers of the second up clock signal and the second down clock signal in the predetermined period.

5. The frequency comparator of claim 4, wherein the pulse number comparator comprises:

a pulse width equalizer converting the second up clock signal and the second down clock signal to a third up clock signal and a third down clock signal both with constant pulse widths;

a pulse width calculator receiving the third up clock signal and the third down clock signal to output first and second output signals, wherein the first and second output signals respectively correspond to the total pulse widths of the third up clock signal and the third down clock signal in the predetermined period; and a comparator receiving the first and second output signals to compare the frequencies of the first clock signal and the reference clock signal based on the first and second output signals.

6. The frequency comparator of claim 5, wherein the voltages of the first and second output signals respectively correspond to the total pulse widths of the third up clock signal and the third down clock signal in the predetermined period; and wherein the comparator compares the frequencies of the first clock signal and the reference clock signal by comparing the voltages of the first and second output signals.

7. The frequency comparator of claim 6, wherein the pulse width calculator comprises:

a first charging-discharging circuit comprising:

first and second switches respectively controlled by the third up clock signal and a third inverted down clock signal, wherein the third inverted down clock signal is an inverted signal of the third down clock signal; and a first capacitor, with one end connected to the first and second switches and outputting the first output signal, discharged when the third up clock signal is at a first level and charged when the third inverted down clock signal is at a second level; and a second charging-discharging circuit comprising:

third and fourth switches respectively controlled by the third down clock signal and third inverted up clock signal, wherein the third inverted up clock signal is an inverted signal of the third up clock signal; and a second capacitor, with one end connected to the third and fourth switches and outputting the second output signal, discharged when the third down clock signal is at the first level and charged when the third inverted up clock signal is at the second level.

8. The frequency comparator of claim 5, wherein the pulse width equalizer comprises respectively first and second delays; and a first and second D-flip flop, with clock input terminals respectively receiving the second up clock signal and the second down clock signal, with data input terminals both connected to a voltage source, with output terminals providing respectively the third up clock signal and the third down clock signal, with inverted output terminals providing respectively inverted signals of the third up clock signal and the third down clock signals to input terminals of the first and second delays, and with reset terminals respectively connected to output terminals of the first and second delays.

9. The frequency comparator of claim 4, wherein the pulse number comparator comprises:

first and second counters respectively receiving the second up clock signal and the second down clock signal to respectively register the total pulse numbers of the second up clock signal and second down clock signal as first and second numbers; and a number comparator compares the frequencies of the first clock signal and the reference clock signal by comparing the first and second numbers.

* * * * *